United States Patent
Liu et al.

(10) Patent No.: US 10,813,226 B2
(45) Date of Patent: Oct. 20, 2020

(54) PROCESS FOR IMPROVING PERFORMANCE OF SLIDING RHEOSTAT OF 5G COMMUNICATION HIGH-FREQUENCY SIGNAL BOARD

(71) Applicant: Kunshan TVS Electronic Technology Co., Ltd, Kunshan (CN)

(72) Inventors: Jiting Liu, Kunshan (CN); Qingfeng Liu, Kunshan (CN)

(73) Assignee: KUNSHAN TVS ELECTRONIC TECHNOLOGY CO., LTD, Kunshan (CN)

( * ) Notice: Subject to any disclaimer, the term of this patent is extended or adjusted under 35 U.S.C. 154(b) by 292 days.

(21) Appl. No.: 15/896,062

(22) Filed: Feb. 14, 2018

(65) Prior Publication Data

US 2018/0184527 A1    Jun. 28, 2018

(30) Foreign Application Priority Data

Jan. 8, 2018  (CN) .......................... 2018 1 0014763

(51) Int. Cl.
*H05K 3/00* (2006.01)
*H05K 3/26* (2006.01)
(Continued)

(52) U.S. Cl.
CPC ............. *H05K 3/26* (2013.01); *B24B 29/005* (2013.01); *C23C 18/54* (2013.01); *C25D 3/48* (2013.01); *C25D 5/12* (2013.01); *C25D 5/34* (2013.01); *C25D 7/00* (2013.01); *H05K 1/0373* (2013.01); *H05K 3/22* (2013.01); *H05K 3/28* (2013.01);
(Continued)

(58) Field of Classification Search
CPC ... B24B 29/005; C23C 18/1831; C23C 18/54; C25D 3/48; C25D 5/12; C25D 5/34; C25D 3/12; C25D 7/00; H05K 1/0373; H05K 3/22; H05K 3/244; H05K 3/26; H05K 3/28; H05K 2203/0195; H05K 2203/0257; H05K 2203/0228; H05K 2203/0723; H05K 2203/1105; H05K 2201/09881; H01C 10/00; H01C 10/30; H01C 17/00
See application file for complete search history.

(56) References Cited

U.S. PATENT DOCUMENTS 6,642,808 B2 * 11/2003 Koriyama ............... H01L 23/66
                                                       257/728
10,212,824 B2 *  2/2019 Liu ........................ H05K 3/227

* cited by examiner

*Primary Examiner* — Paul D Kim

(74) *Attorney, Agent, or Firm* — Bayramoglu Law Offices LLC

(57) ABSTRACT

A process for improving the performance of the sliding rheostat of 5G communication high-frequency signal board with the sliding rheostat slides along between two bonding pads, includes the following steps: outer layer etching; resin plugging: a. plugging the resinous ink into the pre-plugging position; b: baking, baking on the baking plate of the oven after the plugging is finished; board polishing: using a ceramic brush to process the plugged board, then using a non-woven fabric blush to polish the surface that is polished by ceramic brush. The present invention provides a process for improving the performance of the sliding rheostat of 5G communication high-frequency signal board. The resin plugging method is used to plug the gap between the conductors of the sliding rheostat, so as to prevent the sliding rheostat from being unable to slide due to the altitude difference between conductors of the high-frequency signal board.

10 Claims, 2 Drawing Sheets

(51) Int. Cl.
*H05K 1/03* (2006.01)
*B24B 29/00* (2006.01)
*C25D 3/48* (2006.01)
*C25D 5/34* (2006.01)
*C25D 5/12* (2006.01)
*C25D 7/00* (2006.01)
*H05K 3/22* (2006.01)
*C23C 18/54* (2006.01)
*H05K 3/28* (2006.01)
*H01C 17/00* (2006.01)
*C25D 3/12* (2006.01)
*H01C 10/00* (2006.01)
*H05K 3/24* (2006.01)
*H01C 10/30* (2006.01)
*C23C 18/18* (2006.01)

(52) U.S. Cl.
CPC ............ *C23C 18/1831* (2013.01); *C25D 3/12* (2013.01); *H01C 10/00* (2013.01); *H01C 10/30* (2013.01); *H01C 17/00* (2013.01); *H05K 3/244* (2013.01); *H05K 2201/09881* (2013.01); *H05K 2203/0195* (2013.01); *H05K 2203/0228* (2013.01); *H05K 2203/0257* (2013.01); *H05K 2203/0723* (2013.01); *H05K 2203/1105* (2013.01)

PROCESS FOR IMPROVING PERFORMANCE OF SLIDING RHEOSTAT OF 5G COMMUNICATION HIGH-FREQUENCY SIGNAL BOARD

CROSS REFERENCE TO RELATED APPLICATIONS

This application is based upon and claims priority to Chinese Patent Application No. 201810014763.X, filed on Jan. 8, 2018, the entire contents of which are incorporated herein by reference.

TECHNICAL FIELD

The present invention relates to a fabrication process of a high-frequency signal board, particularly to a fabrication process for 5G high-frequency communication signal board.

BACKGROUND 5G is the fifth generation of moving communication standard of mobile phones, also known as the fifth generation mobile communication technology. 5G is an extension of 4G which is under study, and the connection speed thereof is up to 5 M/S-6 M/S.

In the field of communications, the frequency band refers to the frequency range of electromagnetic waves in the unit of Hz. According to the measurement of the frequency, the frequencies can be divided into the following bands, i.e., very low frequency ranging from 3 kHz to 30 kHz; low frequency ranging from 30 kHz to 300 kHz; medium frequency ranging from 300 kHz to 3000 kHz; high frequency ranging from 3 MHz to 30 MHz very high frequency ranging from 30 MHz to 300 MHz; ultra high frequency ranging from 300 MHz to 3000 MHz; super high frequency ranging from 3 GHz to 30 GHz; extremely high frequency ranging from 30 GHz to 300 GHz; super-extremely high frequency ranging from frequency 300 GHz to 3000 GHz. The working frequency bands of the fifth generation mobile communication technology (5G) are 3300-3600 MHz and 4800-5000 MHz belonging to the high frequency band, wherein the frequency band of 3300-3400 MHz is principally limited to be used indoor. The transmission of the high frequency band is the transmission of different waveforms. Thus, a structure that is similar to a sliding rheostat is required to control the resistance so as to achieve the purpose of adjusting the current amplitude to control the waveform. Moreover the sliding rheostat structure is provided between the gold-plated bonding pads of the 5G high-frequency signal board.

In the design of the original process of 5G high-frequency signal board, the gap between two gold-plated bonding pads are covered with ink. Here, the ink has two defects. First, since the hardness of the ink does not meet the requirement, the ink cracks after long-time use, causing the sliding rheostat structure to stuck between two gold-plated bonding pads and unable to move. Second, since an altitude difference between the ink and the gold-plated surface occurs after printing, that is, they are not in the same plane, a stuck phenomenon of the sliding rheostat structure may appear at the junction of the ink and the gold-plated bonding pad. If the usage time is long or the number of sliding exceeds a certain number, the gold will peel off from the edge of the gold-plated bonding pad, resulting in shortening of service life, affecting the transmission of 5G signals.

SUMMARY OF THE INVENTION

The present invention provides a process for improving the performance of the sliding rheostat of 5G communication high-frequency signal board. The resin plugging method is used to plug the gap between the conductors of the sliding rheostat, so as to prevent the altitude difference between conductors of the high-frequency signal board impacting the sliding operation of the sliding rheostat. The service life of the sliding rheostat is extended. The market competitiveness of products is enhanced, which is the technological revolution in the production process of the 5G high-frequency signal board.

In order to solve the above technical problems, the technical solution adopted by the present invention is as explained ahead. A performance improvement process for a sliding rheostat of a 5G communication high-frequency signal board is provided, wherein the sliding rheostat slides between two bonding pads. The process is performed according to the following steps:

outer layer etching: providing a pre-plugging position between the two bonding pads; making an opening window on an outer layer exposed material at the pre-plugging position when the outer layer is exposed; wherein an edge of the opening window is 8 to 12 mil away from an edge of the bonding pad; and after etching residual copper cannot be left at the pre-plugging position:

Resin Plugging:

a. plugging resinous ink into the pre-plugging position, wherein the resinous ink used has a fluidity that is greater than or equal to 1 mm and a Engler viscosity of 150 s to 300 s at a temperature of 20° C.; the resinous ink is a single-component thermohardening plugging ink; the single-component thermohardening plugging ink comprises 45% to 60% of epoxy resin, 40% to 55% of calcium carbonate filler, and 4% to 14% of curing agent, the above percentages are mass percentages;

b. baking: after the plugging is completed, placing on a baking plate inside an oven: baking at a temperature of 70 to 80° C. for 10 to 20 min; and then baking at a temperature of 120 to 180° C. for 20 to 40 min;

board polishing: processing the plugged board with a ceramic brush; then polishing the surface that is polished by the ceramic brush with a non-woven fabric brush; wherein an altitude difference between the copper surface and the resin surface is less than 5 μm.

Further, the fabrication process of the high-frequency signal board successively includes the following steps: cutting, board baking, inner circuit, electroplating, outer layer etching, resin plugging, board polishing, dry film station, gold-plating station, outer circuit, optical inspection, solder mask, texting, paneling, electrical inspection and visual inspection.

Further, in the resin plugging process, the vacuum plugging machine requires that the scraper has a thickness of more than 2 mm, a hardness of 70-80 degrees and has strong acid-resistant and strong alkali-resistant properties. Before the plugging, a screen printing plate with the mesh size of 300 meshes is selected. The pressure should be greater than or equal to 8.0 kg/cm$^2$. After the plugging, the plumpness is required to reach more than 95% without bubbles or uneven plug holes.

Further, during the baking, baking at a temperature of 75° C. for 15 min first, and then baking at a temperature of 150° C. for 30 minutes.

Further, when polishing the board, the ceramic brush wheel requires a mesh number of 600 meshes, a ceramic plate thickness of 8 mm, a speed of 2.5 m/min and a polishing current of 2.7 A.

Further, when polishing the board, nonwoven brush Wheel requires a mesh number of 1200 meshes, a speed of 2.5 m/min, and a polishing current of 2.9 A.

Further, the single-component thermohardening plugging ink comprises 50-55% of epoxy resin, 44-50% of calcium carbonate filler, and 6-10% of curing agent.

Further, the edge of window is 10 mil away from the edge of the bonding pad.

Further, in the gold-plating station, before the gold-plating of the plug, the copper surface is cleaned, dried and acid-pickled to ensure that the copper surface does not get oxidized. In the gold-plating process, the nickel-plating is performed first, and then an activating treatment is performed. After that, the gold-plating is performed. The gold surface is required to be lustrous and not rough after being gold-plated.

Further, in the dry film station, the opening windows of the outer layers are made on the circuit required to be gold-plated and connected to the gold-plated bonding pads. Then, the developing and drying are performed.

The advantages of the present invention are as follows.

In the fabrication process of the 5G high-frequency communication signal board, the resin plugging method is used to plug the gap between the conductors of the sliding rheostat, so as to prevent the altitude difference between conductors of the high-frequency signal board from making the sliding rheostat unable to slide. Since the insulation, abrasion resistance, and smoothness of resinous ink are superior to those of the ink, the service life and the convenience of usage of the sliding rheostat are greatly improved. Thus, the transmission rate and reliability of 5G signals are improved. The present invention has a good practicability, facilitating a wide range of promotion, bringing the technological revolution to the production process of 5G communication high-frequency signal board.

The above description of the present invention is merely an overview of the technical solutions of the present invention. In order to clearly understand the technical solutions of the present invention and implementing according to the description, the preferred embodiments of the present invention are described in detail below.

Figure 1:
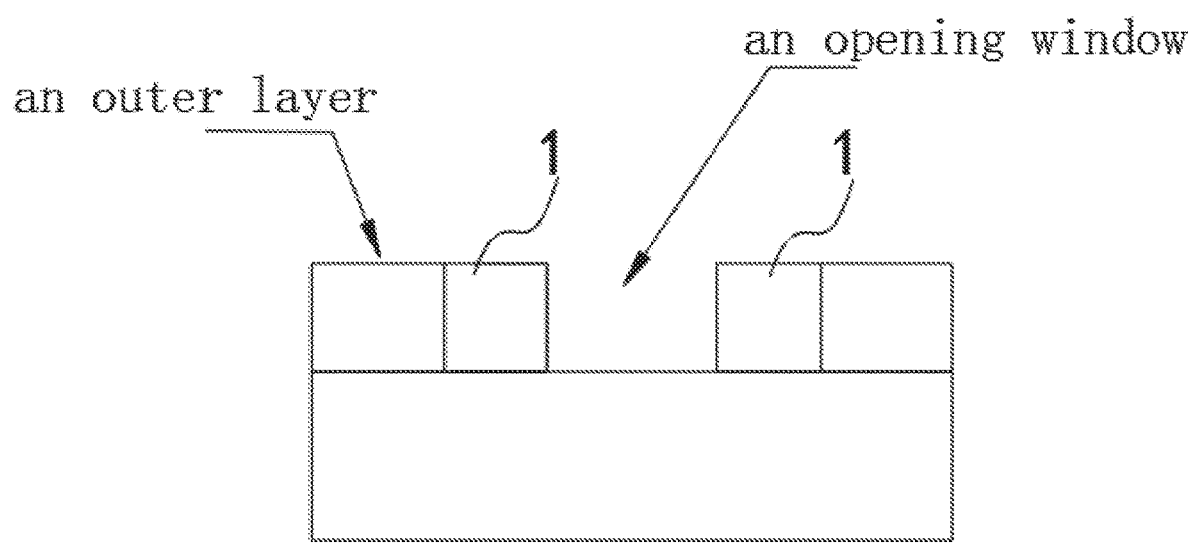
FIG. 1 is the first schematic diagram of the process of the present invention.

The parts of the drawings are labeled as below:

bonding pad 1, pre-plugging position 2, gold-plated bonding pad 3, sliding rheostat 4, and pin 5.

DETAILED DESCRIPTION OF THE INVENTION

Specific implementations of the present invention will be described below through specific embodiments. Those skilled in the art can easily understand the advantages and efficacy of the present invention from the contents disclosed in this specification. The present invention may be embodied in other various forms. That is, various modifications and changes may be made without departing from the scope of the present invention.

Embodiment: a process for improving the performance of the sliding rheostat of 5G communication high-frequency signal board, with the sliding rheostat 4 sliding along between the two bonding pads 1, is performed according to the following steps:

Outer layer etching: a pre-plugging position 2 is disposed between the two bonding pads. When the outer layer is exposed, an opening window is made at the pre-plugging position of the outer exposed material. The edge of the window is 10 mil away from the edge of the bonding pad. The copper on the edge of the board should be protected during the gold-plating process. During the exposure process of the outer layer, a 41-order energy ruler is used to control the energy within a range of 14±2 grids. The line speed of outer layer etching is set in accordance with the thickness of the copper. The pre-plugging position cannot have residual copper after etching, as shown in FIG. 1.

Resin Plugging:

a. The resinous ink is plugged into the pre-plugging position, wherein the resinous ink has a fluidity ≥1 mm and a Engler viscosity of 150-300 s at a temperature of 20° C. The resinous ink is a single-component thermohardening plugging ink. The single-component thermohardening plugging ink comprises 50-55% of epoxy resin, 44-50% of calcium carbonate filler, and 6-10% of curing agent. The above ratios are parts by mass. The color of ink in the production process is creamy white.

Figure 2:
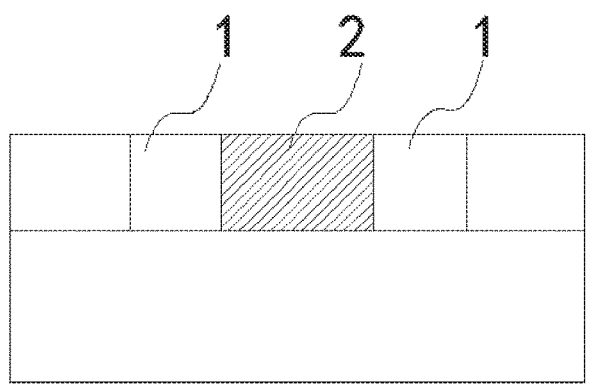
FIG. 2 is the second schematic diagram of the process of the present invention.

In the above resin plugging process, the vacuum plugging machine requires that the scraper has a thickness of more than 2 mm, a hardness of 70-80 degrees, and has strong acid-resistant and strong alkali-resistant properties. Before plugging, a screen printing plate with the mesh size of 300 meshes is selected. The pressure should be greater than or equal to 8.0 kg/cm$^2$. After plugging, the plumpness is required to reach more than 95% without bubbles or uneven plug holes.

b. Baking: place on baking plate inside the oven after the plugging is completed. The baking is conducted at a temperature of 70-80° C. for 10-20 min, and then at a temperature of 120-180° C. for 20-40 min;

Board polishing: a ceramic brush is used to process the plugged board. Then, a non-woven fabric brush is used to polish the surface that is polished by the ceramic blush. After board polishing, the altitude difference between the copper surface and the resin surface is less than 5 μm. The function of polishing with ceramic brush is to cut the resin and copper surface that are higher than the copper surface. The ceramic brush wheel requires the number of meshes to be 600#. The thickness of ceramic plate is 8 mm. The speed is selected to be 2.5 m/min. The polishing current of polishing is 2.7 A. The main function of polishing with the non-woven brush is to polish the resin surface and copper surface and to polish the junction between resin and copper surface to be flattened. The speed is chosen to be 2.5 m/min and the polishing current is 2.9 A, as shown in FIG. 2.

The fabrication process of the high-frequency signal board successively includes the following steps: cutting, board baking, inner circuit, electroplating, outer layer etching, resin plugging, board polishing, dry film station, gold-plating station, outer circuit, optical inspection, solder mask, texting, paneling, electrical inspection and visual inspection.

In the dry film station, the outer layer's opening windows are made on the circuit required to be gold-plated and connected to the gold-plated bonding pads 3. Then, after developing and drying, the quality is fully inspected.

Figure 3:
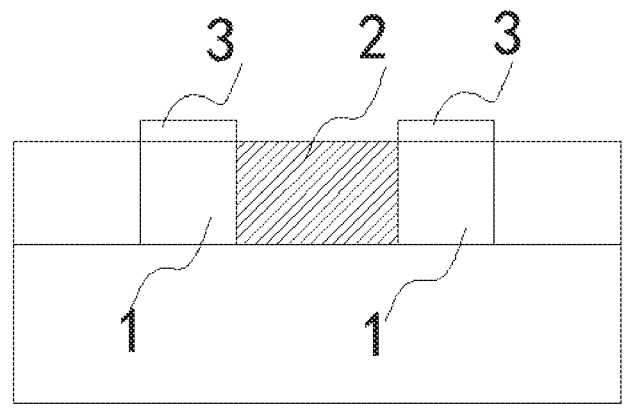
FIG. 3 is the third schematic diagram of the process of the present invention.

In the gold-plating station, before the gold-plating of the plug, the copper surface requires to be cleaned, dried, and acid-pickled to ensure that the copper surface does not get oxidized. In the gold-plating process, the nickel-plating is performed at first, in order to ensure good adhesion of the nickel layer and the copper layer of the high frequency signal board, the newly prepared solution uses chemically pure reagent. In the practical production, the pH value is adjusted by 10% sulfuric acid and 10% sodium hydroxide. The electrolyte is performed with a small current of 1.0 A. The formula of nickel-plating solution has 250-300 g/L of nickel sulfate hexahydrate, 35-45 g/L of nickel chloride hexahydrate, 35-45 g/L of boric acid, and brightener. The ratio of brightener to nickel-plating solution is (30-35):1000. After nickel-plating, since nickel is prone to passivating in the air, an activating treatment is performed within 1-3 min after nickel-plating. The activating solution is CP40, 120 g/L. The temperature of the solution is controlled at 50-55° C. The soaking time is about 0.5-2 min. The gold-plating solution includes 2-2.5 g/L of auric potassium cyanide and B0.6-0.8 g of L plating bath solution. The temperature is 50-55° C. The pH value is of 3.2-3.5. A small current of 1.0 A/m$^2$ is selected. Gold-plated surface is required to be lustrous and not rough after gold-plating, as shown in FIG. 3.

In the process of the outer circuit, since the large copper sheet and non-gold-plated circuit are not gold-plated, a dry film is used to protect the outer layer circuit required by the outer layer. The parameters of line speed of the outer layer etching are set in accordance with the copper thickness. During etching, attention should be paid to avoid anomalies of incomplete etching and gold scratches.

In the optical inspection, the gold surface is brighter than the copper surface since the reflectivity of the gold surface is different from that of the copper surface. The grayscale of the optical inspection machine needs to be adjusted. The grayscale, range of the general copper panel is between 130 and 170. In order to scan the entire gold-plated board, the grayscale needs to be adjusted between 70 and 120.

Figure 4:
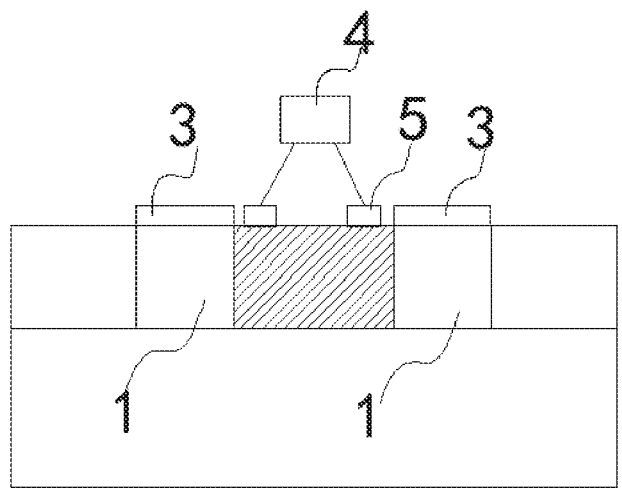
FIG. 4 is the fourth schematic diagram of the process of the present invention.

FIG. 4 is a schematic diagram of the sliding rheostat slier between the two gold-plated bonding pads through two pins 5 after the sliding rheostat is mounted by the customer in the downstream process.

The high-frequency signal board obtained through the present invention, resin used to plug the position between two gold-plated bonding pads. The junction of pre-plugging position of the resin and the gold-plated bonding pad is analyzed through the microsection of the finished production. The altitude difference between them is 3 to 5 μm. 2B pencil is used to slide between two gold-plated bonding pads, and no significant sense of steps occurs. The limit testing is performed with the sliding rheostat. The sliding rheostat can slide between two gold-plated bonding pads for more than 100,000 times. The service life of the sliding rheostat is more than 100,000 times. The wear-resisting performance of resin is much greater than that of the ink. Thus, the service life of the sliding rheostat has been improved, meeting the production requirements.

The above descriptions are merely embodiments of the present invention, and are not intended to limit the scope of the present invention. All equivalent constructions made by using the contents of the specification of the present invention, or directly or indirectly applied to other related technical fields are also included in the protection scope of the present invention.

What is claimed is:

1. A process for improving a performance of a sliding rheostat of 5G communication high-frequency signal board, the sliding rheostat sliding between two bonding pads, the process comprising the following steps:

outer layer etching: providing a pre-plugging position between the two bonding pads; making an opening window on an outer layer of the 5G communication high-frequency signal board exposed material at the pre-plugging position when the outer layer of the 5G communication high-frequency signal board is exposed; wherein an edge of the opening window is 8 to 12 mil away from an edge of the bonding pad;

resin plugging:
  a. plugging resinous ink into the pre-plugging position, wherein the resinous ink used has a fluidity that is greater than or equal to 1 mm and a Engler viscosity of 150 s to 300 s at a temperature of 20° C.; the resinous ink is a single-component thermohardening plugging ink; the single-component thermohardening plugging ink comprises 45% to 60% of epoxy resin, 40% to 55% of calcium carbonate filler, and 4% to 14% of curing agent, the above percentages are mass percentages; and
  b. baking: after the plugging is completed, placing the 5G communication high-frequency signal board on a baking plate inside an oven; baking the 5G communication high-frequency signal board at a temperature of 70 to 80° C. for 10 to 20 min; and then baking at a temperature of 120 to 180° C. for 20 to 40 min; and board polishing: processing a plugged board with a ceramic brush; then polishing a surface of the 5G communication high-frequency signal board that is polished by the ceramic brush with a non-woven fabric brush; wherein an altitude difference between a copper surface and a resin surface is less than 5 μm.

2. The process for improving the performance of the sliding rheostat of 5G communication high-frequency signal board according to claim 1, further comprising
  a fabrication process of high-frequency signal board successively comprises cutting, board baking, inner circuit, electroplating, outer layer etching, resin plugging, board polishing, dry film station, gold-plating station, outer circuit, optical inspection, solder mask, texting, paneling, electrical inspection and visual inspection.

3. The process for improving the performance of the sliding rheostat of 5G communication high-frequency signal board according to claim 1, wherein
  during the process of the resin plugging, a vacuum plugging machine requires that a scraper has a thickness of more than 2 mm, a hardness of 70 to 80 degrees, and properties of strong acid-resistant and strong alkali-resistant;
  before the resin plugging, a screen printing plate with a mesh size of 300 meshes is selected;
  a pressure is required to be greater than or equal to 8.0 kg/cm$^2$; and
  after the resin plugging, a plumpness is required to reach more than 95% without bubbles or uneven plug holes.

4. The process for improving the performance of the sliding rheostat of 5G communication high-frequency signal board according to claim 1, wherein
  during the baking, baking at a temperature of 75° C. for 15 min first, and then baking at a temperature of 150° C. for 30 min.

5. The process for improving the performance of the sliding rheostat of 5G communication high-frequency signal board according to claim 1, wherein
  during the board polishing, a ceramic brush wheel requires a mesh number of 600 meshes;

a thickness of a ceramic plate is 8 mm;
a speed is selected to be 2.5 m/min; and
a polishing current is 2.7 A.

6. The process for improving the performance of the sliding rheostat of 5G communication high-frequency signal board according to claim 1, wherein
during the board polishing, a non-woven fabric brush wheel requires a mesh of 1200 meshes, a speed of 2.5 m/min, and a polishing current of 2.9 A.

7. The process for improving the performance of the sliding rheostat of 5G communication high-frequency signal board according to claim 1, wherein
the single-component thermohardening plugging ink comprises 50% to 55% of epoxy resin, 44% to 50% of calcium carbonate filler, and 6% to 10% of curing agent.

8. The process for improving the performance of the sliding rheostat of 5G communication high-frequency signal board according to claim 1, wherein
the edge of the opening window is 10 mil away from the edge of the bonding pad.

9. The process for improving the performance of the sliding rheostat of 5G communication high-frequency signal board according to claim 1, wherein
in a gold-plating station, cleaning, drying, and acid-pickling the copper surface before the gold-plating of a plug to ensure that the copper surface will not be oxidized;
in the gold-plating process, performing a nickel-plating at first, and then performing activating treatment; wherein a gold-plated surface is required to be lustrous and not rough after the gold-plating.

10. The process for improving the performance of the sliding rheostat of 5G communication high-frequency signal board according to claim 1, further comprising
in a dry film station, making the opening window of the outer layer of the 5G communication high-frequency signal board on a circuit required to be gold-plated and connected to a plurality of gold-plated bonding pads, and then performing a developing and drying.

* * * * *